United States Patent [19]
Miller

[11] Patent Number: 5,640,108
[45] Date of Patent: Jun. 17, 1997

[54] SINGLE STAGE DYNAMIC RECEIVER/ DECODER

[75] Inventor: Christopher P. Miller, Underhill, Vt.

[73] Assignee: International Business Machines Corporation, Armonk, N.Y.

[21] Appl. No.: 486,220

[22] Filed: Jun. 7, 1995

[51] Int. Cl.⁶ .............................................. H03K 19/0175
[52] U.S. Cl. ............................................ 326/105; 326/98
[58] Field of Search .............................. 326/38, 93, 98, 326/105, 108, 121

[56] References Cited

U.S. PATENT DOCUMENTS

| | | |
|---|---|---|
| 4,570,084 | 2/1986 | Griffin et al. .................... 326/93 X |
| 4,684,829 | 8/1987 | Uratani ............................. 326/108 |
| 4,953,130 | 8/1990 | Houston . |
| 5,015,882 | 5/1991 | Houston et al. ................... 326/93 X |
| 5,047,983 | 9/1991 | Iwai et al. . |
| 5,161,120 | 11/1992 | Kajimoto et al. . |
| 5,200,926 | 4/1993 | Iwahashi et al. . |
| 5,329,176 | 7/1994 | Miller, Jr. et al. ................. 326/98 |

*Primary Examiner*—David R. Hudspeth
*Attorney, Agent, or Firm*—Whitham, Curtis, Whitham & McGinn; Charles W. Peterson, Jr.

[57] ABSTRACT

A high performance receiver/decoder circuit combines input signal detection and decoding to a one-of-n selection signal in a single stage. Particularly when implemented in dynamic logic, speed of decoding is substantially increased while reset and precharge circuits and procedures are greatly simplified which is accomplished by placing logic trees in series with a latch circuit and a common connection to a transistor or other circuit for enabling input evaluation. The decoder is preferably implemented with a plurality of identical circuits with true and complement inputs selectively distributed thereto, as may be convenient to the circuit design.

20 Claims, 4 Drawing Sheets

SINGLE STAGE DYNAMIC RECEIVER/DECODER

BACKGROUND OF THE INVENTION

1. Field of the Invention

The present invention generally relates to logic circuits for code conversion and electronic integrated circuits comprising or including such circuits and, more particularly, to the design and architecture of such circuits which can perform code conversion with increased speed particularly for address decoding.

2. Description of the Prior Art

Since the early development of integrated circuits, it has been possible to place more devices on a single chip or in a single circuit package than can be individually accessed with a convenient number of connections to the chip or package. While there is no theoretical limit on the number of connections which can be made to a chip or circuit package, as a practical matter only the most complex of integrated circuits are provided with external connections which number more than a few hundred. As an extreme example, memories which provide even a modest number of individually accessible storage devices, by current standards, are of a size which does not permit external connections to individual cells (e.g. two to four flip-flops or logic circuits in a so-called dual in-line pin (DIP) package is exemplary of a commercial limit on individual accessibility which has been generally observed).

For this reason, it has been customary for many years to provide a decoder on chips which include more than a very few individually accessible devices of a similar type. By this rather simple and straight-forward expedient, upwards of several million memory cells which may be placed on a single chip in accordance with current dynamic memory technology may be accessed with only approximately twenty bits of address code; a logic circuit decoder placed on a small portion of the chip in a compact layout providing selection of a particular bit or device (usually as the intersection of a word line and a bit line by separately decoding low- and high-order bits of the address as row and column addresses) providing a code conversion for selection. Similarly, it may be convenient for various design reasons, such as refresh of dynamic circuits, to partition the device into sections or sub-systems where individual bit access is enabled by simple decoding of one or very few address bits for individual partition enablement while allowing some operations to be carried out in all or a plurality of partitions. Other types of code conversion are well-known for decoding purposes in integrated circuit structure for accommodation of numerous other or specialized functions.

In digital logic circuits and circuits for data processing applications, in general, greatest generality (and, hence, greatest operational flexibility) is achieved when a selection function results from a code conversion. More specifically, many code conversion applications involve a conversion from an arbitrary binary code (e.g. hex, excess-3, etc.) into a one-of-n code in which a unique signal (hence "selection") will appear on a single one of a plurality of output lines. Such a unique selection signal allows direct enablement of circuits or devices with simplified interconnection wiring as well as a reduction in the component count and layout complexity of the circuits since the detection of conditions when enablement should occur (or at least a portion thereof) is transferred to the code converter.

In order to obtain greater switching speed from logic circuits in general, there has been much recent interest in so-called dynamic logic circuits, sometimes referred to more simply as "dynamic circuits" or "dynamic logic". (All of these terms should be understood to be distinct from the term "dynamic memory", mentioned above, which requires refresh (generally of capacitive storage elements which are subject to leakage) and may include a large number of static logic circuits as well as dynamic logic circuits, as particular designs and requirements of performance and function may dictate.)

The basic principle of dynamic logic circuits is to exploit the inherent asymmetries in response characteristics by precharging the logic circuit and individual devices therein to a logic state from which it may be most rapidly switched to the opposite logic state and then only if necessitated by the inputs applied thereto when "evaluation" of the inputs is performed at the termination of or subsequent to precharge (e.g. after "reset" if a reset operation is provided). Such a mode of operation also inherently provides latching and substantial noise immunity as well as allowing the size of many transistors in the circuit to be reduced in comparison with the necessary size of the transistors which would be required to obtain a more symmetrical response or static operation.

Timing of signals, however, is relatively critical in dynamic logic circuits and inputs must be present at inputs prior to evaluation. For this reason, it is common practice to separately "receive" and latch input signals prior to evaluation by dynamic logic; requiring separately clocked "evaluation" of the input signal in order to latch the input onto the dynamic logic prior to evaluation. Error recovery generally cannot be accomplished in the same operational cycle due to the inherent latching until subsequent reset and/or precharge are performed. Further, each stage of the propagation of signals through dynamic logic circuits, particularly if serially connected, must be conducted in a sequence. Therefore, there is a theoretical time penalty for each serial stage of dynamic logic. Highest propagation speed through a plurality of dynamic logic stages may require relatively complex sequencing logic for reset and precharge signals. So-called self-resetting dynamic logic develops a sequence of reset and/or precharge signals by detection of the arrival of a stable logic signal at an output of the circuit; thus requiring additional logic stages and further complicating the sequence of reset and precharge signals which are required for correct operation.

Additionally, while decoder circuit complexity is generally a function of the number of address signal combinations which must be decoded, the architecture of such decoders is generally a matter of the technology with which the logic function is implemented. Therefore, for a given technology, such as dynamic logic circuits, there has been a degree of circuit complexity which could not be reduced and which has limited performance regardless of the simplicity of the code conversion function which was required (e.g. one of two, one of four, two of four, etc. as contrasted, for example, with word line or bit line decoders which might be encountered in large memory addressing schemes). While such complexity of architecture might be tolerable in large decoders, the operational overhead in complex sequencing of operations is disproportionately expensive to fabricate and compromising to operational speed of decoders of more simple function.

SUMMARY OF THE INVENTION

It is therefore an object of the present invention to provide an architecture of a decoder circuit which provides high speed of performance of a selection operation together with simplified and modular circuit design.

It is another object of the invention to provide a decoder or code conversion circuit capable of selection and which can be implemented in dynamic logic circuitry having effectively combined receiving and decoding functions.

It is a further object of the invention to provide a dynamic logic selection circuit having a reduced device count, improved speed of operation, simplified reset and precharge functions and which is particularly well-suited for low-level decoding of address signals to a small number of selection signals; the principles of which are applicable to larger, more complex decoders with consequent improvement in performance and ease of design, fabrication and manufacturing yield.

In combination with the above objects of the invention, it is yet another object of the invention to provide a decoder in which output signals may be maintained independently of input signals or evaluation operations either with or without further provision for truncation or reset of output signals.

In order to accomplish these and other objects of the invention, a receiver/decoder implemented in dynamic logic is provided including at least two selector circuits connected to a plurality of input signals in distinct orders, each comprising a latch circuit having two transistors, at least two logic tree circuits, each respective logic tree circuit being serially connected with one transistor of the latch circuit, and a clock transistor connected in series with at least one of the logic tree circuits.

In accordance with another aspect of the invention, a partitioned integrated circuit is provided including a receiver/decoder circuit including at least two selector circuits connected to a plurality of input signals in distinct orders, each selector circuit comprising a latch circuit having two transistors, at least two logic tree circuits, each respective logic tree circuit being serially connected with one transistor of latch circuit, and a clock transistor connected in series with at least one of the logic tree circuits and an arrangement responsive to an output of the two selector circuits for enabling a partition.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
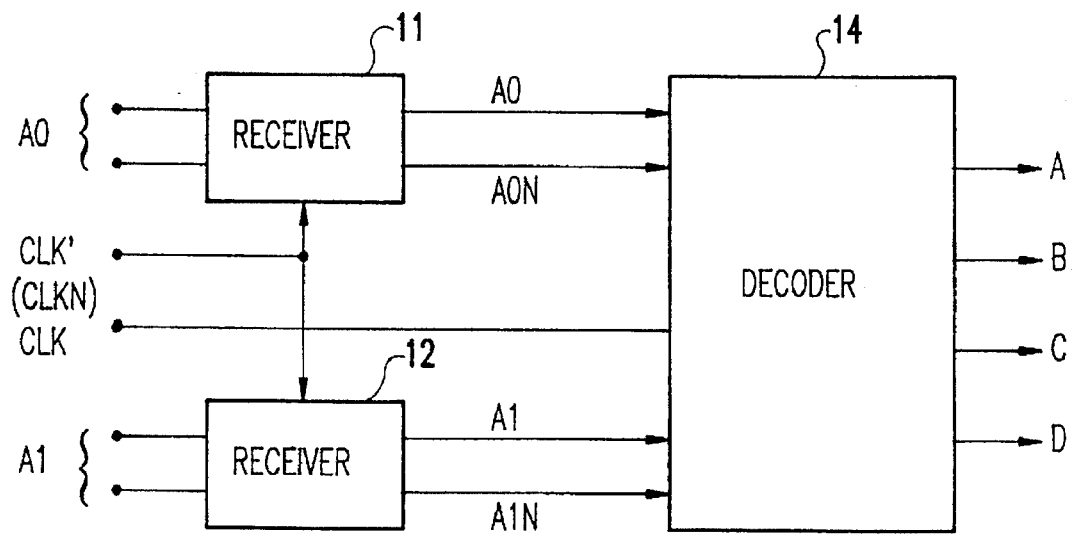
FIG. 1 is a block diagram of a conventional architecture for an exemplary four output selection circuit, particularly as implemented in dynamic logic.

Referring now to the drawings, and more particularly to FIG. 1, there is shown a conventional architecture for an exemplary four output selection circuit, particularly as implemented in dynamic logic. It is to be understood, however, that no part of this illustration is admitted to be prior art as to the present invention but is presented to convey an understanding of the technology over which the present invention provide advantages and improvements. Accordingly, FIG. 1 has been labelled "Related Art". This circuit must perform the functions of address detection, address decoding and output buffering.

As indicated above, dynamic logic circuits, in particular, require an unambiguous input signal to be present for proper operation although input latching or buffering is a conventional error prevention technique in other logic circuit design utilizing earlier technologies. Accordingly, the receiver function of detecting the presence of an address and the decoder function of code conversion such as generation of a selection signal are generally separated into receivers 12, 12 and decoder 14.

The requirement for an unambiguous input signal is particularly critical in address decoders since noise or logic ambiguity on a single one of a plurality of inputs may compromise the decoder operation and cause a logic error. Therefore, the architecture depicted in which the receiver and decoder functions are separated with buffering. Latching of signals input to the decoder stage is also utilized in decoder structures other than those implemented in dynamic logic.

Specifically, receivers 11 and 12 perform the functions of evaluating the inputs A0 and A1 (which may be provided singly or in the two-rail configuration depicted) as a function of the clock CLK, used to trigger evaluation of the decoder 14 inputs, or more often, a separate clock (e.g. CLK', as shown) or clock phase (e.g. CLKN, the inverse of CLK) and buffer these input signals out to a decoder stage 14. This evaluation and buffering requires a finite delay (for response to the clock) and a finite propagation time, including time for the buffer circuit to assume a stable latched state. When implemented in dynamic logic, the separation of the receiver and decoder functions generally infers a requirement for timing of reset and/or precharge to be sequenced with the decoder so that latched and stable signals from the receivers will be available at the receiver outputs prior to evaluation by the decoder.

While not of particular importance to the principles of the invention or the understanding and practice thereof by those skilled in the art, it should be noted that the receiver stage is also depicted as providing both true and complement signals (e.g. A0, A0N, A1, A1N) to the decoder stage 14 as is generally done for optimization of the code converter design. It is unimportant, however, whether these true and complement signals are provided as inputs to the receivers 11, 12, provided within receivers 11, 12, or within decoder 14, as these signals may be generated in an unclocked fashion or in any of a number of other ways well-understood in the art which does not compromise response speed of the overall circuit.

Figure 2:
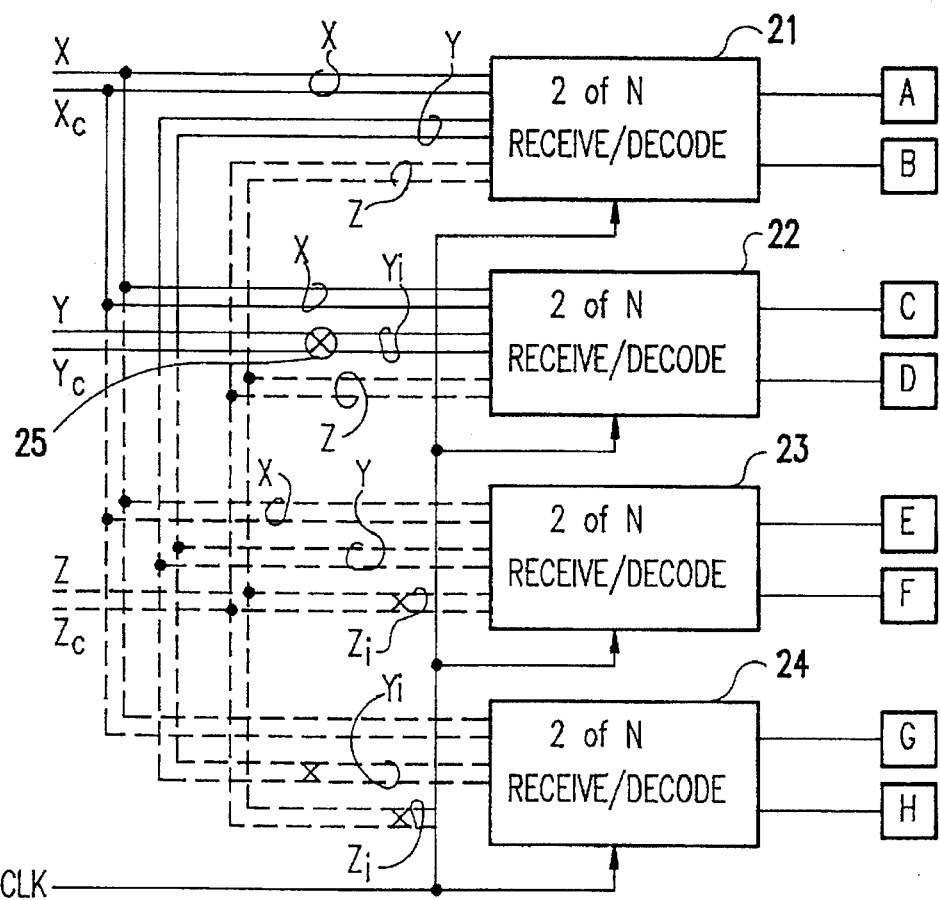
FIG. 2 is a block diagram of an architecture for an exemplary four output selection circuit in accordance with the invention and illustrating expansion to eight outputs.

Referring now to FIG. 2, it will be readily observed that the architecture of a decoder circuit in accordance with the invention combines the receiver and decoder functions into a single clocked stage comprising two decoders, each preferably having a 2-of-$2^N$ (more usually referred to simply as 2-of-N, as will be done hereinafter) selection function of simple design operating in parallel. More decoders, possibly of increased complexity, could be used for more complex decoding or selection functions, as will be discussed below in regard to the exemplary portion of FIG. 2 illustrated with dashed lines. It should be understood, as in the case of the architecture of FIG. 1, that the inputs include both true and complement signals but it remains unimportant to the practice of the invention where the complement signals are developed.

It can also be discerned from FIG. 2 that the A0 and A1 inputs of FIG. 1, indicated as X and Y (and Z) inputs of FIG. 2, and their complements are applied in a different order to respective ones of receiver/decoder 21 and receiver/decoder 22, as shown by the reversal or inversion of the order of conductors at 25. The input line pair in which this inverting of true and complement input order should be understood to be a matter of convenience of the correspondence or order of outputs of selection signals A, B, C and D with respect to unique combinations of logic states of inputs X and Y (and Z) and their complements and is not critical to the practice of the invention.

Of somewhat greater importance, however, it should be noted that the true and complement inputs of one signal should be inverted or reversed at one of the receiver/decoder inputs or distinct and preferably distinct orders of input signals provided at the inputs of each respective receiver/decoder if more than two are used. In the illustrated example of FIG. 2, the Y (true) and Yc (complement) are reversed or inverted in order at the inputs of receiver/decoder 22 so that while receiver/decoder 21 receives X and Y signals (e.g. in X, Xc, Y and Yc order), receiver/decoder 22 receives X and Yi signals (e.g. in X, Xc, Yc and Y order). This inversion or reversal allows the input combination (0,0) and (1,1) to be recognized and decoded by one receiver/decoder (e.g. 21) and the input combinations (0,1) and (1,0) to be recognized and decoded by the other receiver/decoder (e.g. 22) and selection, such as of a partition of an integrated circuit as depicted at A-D (or A-G). By virtue of this generalized input connection criterion, which can be implemented in numerous ways as may, for example, be convenient in regard to location on a chip for a particular select output, the invention may be implemented with a plurality of circuits which are identical, or substantially so; simplifying layout and manufacturing processes.

Figure 3:
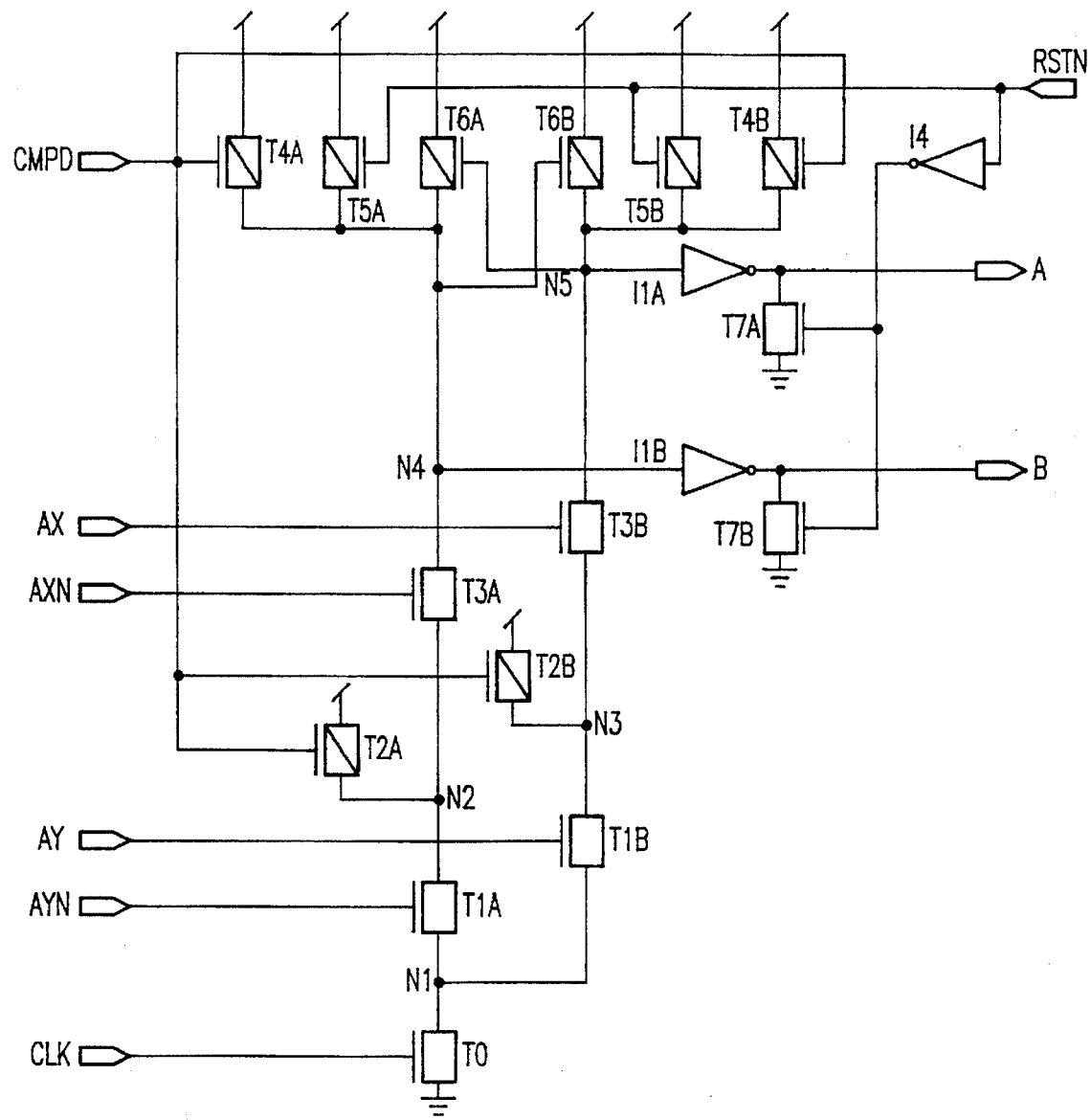
FIG. 3 is an exemplary schematic illustration of a preferred embodiment of the invention performing selection in AND/NAND logic, presented as an expansion of the architecture of FIG. 2.

Specifically, as illustrated in FIG. 3, receiver/decoder 21 has been expanded to a preferred schematic diagram utilizing AND/NAND logic structures for decoding. It should be understood that other logic structures, such as OR/NOR structures, may be predominantly used or combinations of AND/NAND and OR/NOR may be used together to achieve more complex decoding functions. As is generally understood in the art, the difference between AND/NAND and OR/NOR implementations of logic functions lies principally in the senses of the logic values or the voltages by which logic values or the active states of signals are represented, the number of circuits which must be switched in an evaluation operation and whether the connection of transistors implementing the logic is generally serial (as shown in FIG. 3) or generally parallel.

That is, while certain equivalency of some logic circuits is generally recognized (when inputs are appropriately reordered and the logic sense of the input and output is appropriately chosen) as is well understood in the art, it has nevertheless been observed that some logic functions are more easily implemented and will exhibit higher performance than others when constructed using a particular technology as members of a logic family. For those reasons an embodiment employing AND/NAND logic is marginally preferred at the present state of the art in dynamic logic circuit technology.

The circuit illustrated in FIG. 3 provides so-called "true" and "complement" logic trees which are preferably identical including serially connected transistors T1A, T3A and T1B, T3B, respectively. Only one of these logic trees will be conductive at any time since all serially connected transistors in a tree must be rendered conductive by input signals for the tree to be conductive; providing a 2-of-N function. (In OR/NOR logic implementations, all parallel-connected transistors would be rendered conductive.) Any desired logic function or detectable combination of input signals may be achieved by arrangement of inputs to the trees; the true and complement of each input being arranged, relative to the coded signal combinations to be recognized, such that one, none or all logic trees may become conductive. Of course, for purposes of selection, logic is generally arranged so that only one logic tree will become conductive to the mutual exclusion of the other(s).

Similarly and referring briefly to FIG. 2, as between receiver/decoders 22 and 23, inputs are preferably connected such that only one receiver/decoder would recognize a particular combination of active states of true and complement inputs, to the exclusion of the other. That is, if one of receiver/decoders 22, 23 recognized an input combination and responded by placing an active signal (e.g. logic "1") on one of its outputs (the other output remaining at logic "0"), the other receiver/decoder would not recognize an input combination and both of its outputs would be held inactive (e.g. logic "0").

Referring again to FIG. 3, the logic trees are respectively connected to a voltage source by transistors T6A and T6B which are preferably of an opposite conductivity type to the transistors in the logic trees. The control or gate terminal of each of these transistors is connected to the common node of a conduction terminal of the other and its respective logic tree to form a cross-coupled latch circuit. These common nodes N4, N5 also serve as output nodes of the latch and logic circuit (in this case. performing an AND/NAND function). Inverters I1A and I1B may also be provided, as desired or convenient, changing the NAND function to an AND function.

Both logic trees are also connected to a clock transistor T0 to complete a serial connection of the voltage source, latch transistor T6A or T6B, a respective logic tree, clock transistor T0 and a reference voltage (e.g. ground). Since T0 is rendered conductive in response to a clock signal, input signal detection, evaluation and decoding by the logic trees and latching of the outputs are done simultaneously when T0 completes the series circuit. Thus, in accordance with an important feature of the invention, the receiver function and the decoding functions are combined and the input signals need be propagated only through a single dynamic logic stage; insuring high speed performance. The latch formed by transistors T6A, T6B will rapidly be brought to a stable state latching the outputs to solidly drive succeeding circuitry.

In accordance with operation of the circuit of FIG. 3 as a dynamic logic circuit, it is generally desirable to provide for timed termination of the output signals, generally referred to as reset. Reset is generally done prior to or simultaneously with precharge but the terminology should be understood to refer to the function of termination of the output signal to a following stage by which it is usually controlled as a confirmation of successful evaluation. Reset thus allows precharge of a following stage to be conducted earlier and incidentally prevents a precharge operation from propagating an erroneous signal to succeeding circuits. Reset prior to precharging also reduces the currents required for precharging in which numerous nodes are simultaneously pulled to a supply or reference voltage.

Reset is preferably accomplished in the circuit of FIG. 3 by providing reset transistors T5A and T5B in parallel with cross-coupled latch transistors T6A, T6B, discussed above. These reset transistors are rendered simultaneously conductive in response to a reset signal and serve to pull both output nodes of the latch and the inputs of inverters I1A and I1B to the power supply voltage. Inverter I4 is also preferably provided responsive to the reset signal to drive transistors T7A and T7B to a conductive state to pull the outputs of inverters I1A and I1B (and the outputs of the overall receiver/decoder circuit) to the reference voltage, thus terminating the output in a timed manner. Transistors T5A, T5B, T7A and T7B thus should be relatively large (e.g. comparable in conductivity to the latch transistors T6A, T6B and the transistors in inverters I1A, I1B) to provide a solid and rapid switching of the output voltages.

After reset (if provided) is initiated (but preferably slightly overlapped with the reset pulse), precharge may be conducted. Precharging of the dynamic logic circuit of FIG. 3 is preferably provided by the provision of precharge transistors T4A, T4B responsive to precharge signal CMPD in parallel with latch transistors T6A, T6B to precharge output nodes N4, N5 and to hold the cross-coupled latch in a balanced condition in the manner of a sense amplifier. It is also convenient and helpful in avoidance of noise and so-called charge sharing problems to further provide similar precharge transistors to intermediate nodes of the logic tree such as N2, N3 so that all intermediate nodes will be precharged to the same voltage and no conduction will occur regardless of the voltages applied to the control or gate terminals of the transistors in the logic trees. Precharge transistors may be sized substantially smaller than latch and reset transistors, particularly if reset is provided since the balanced state of the latch will have previously been achieved and the precharge circuit merely holds this condition and replenishes any charge lost through leakage until shortly before the next input signal evaluation in response to the clock signal CLK being asserted in an active state.

Of course, numerous variations of the circuit of FIG. 3 can be made within the spirit and scope of the invention in view of the above description of a preferred embodiment of the invention. For example, the latch formed by transistors T6A and T6B could be arranged as a so-called dual-slope sense amplifier to increase sensitivity and response speed. Also, as alluded to above for simplification of the circuit and its operation, reset could be omitted or combined with precharge with a slight increase in power consumption. Somewhat larger conductance of at least some of the reset transistors is also generally required for reliable and fast operation.

Figure 4:
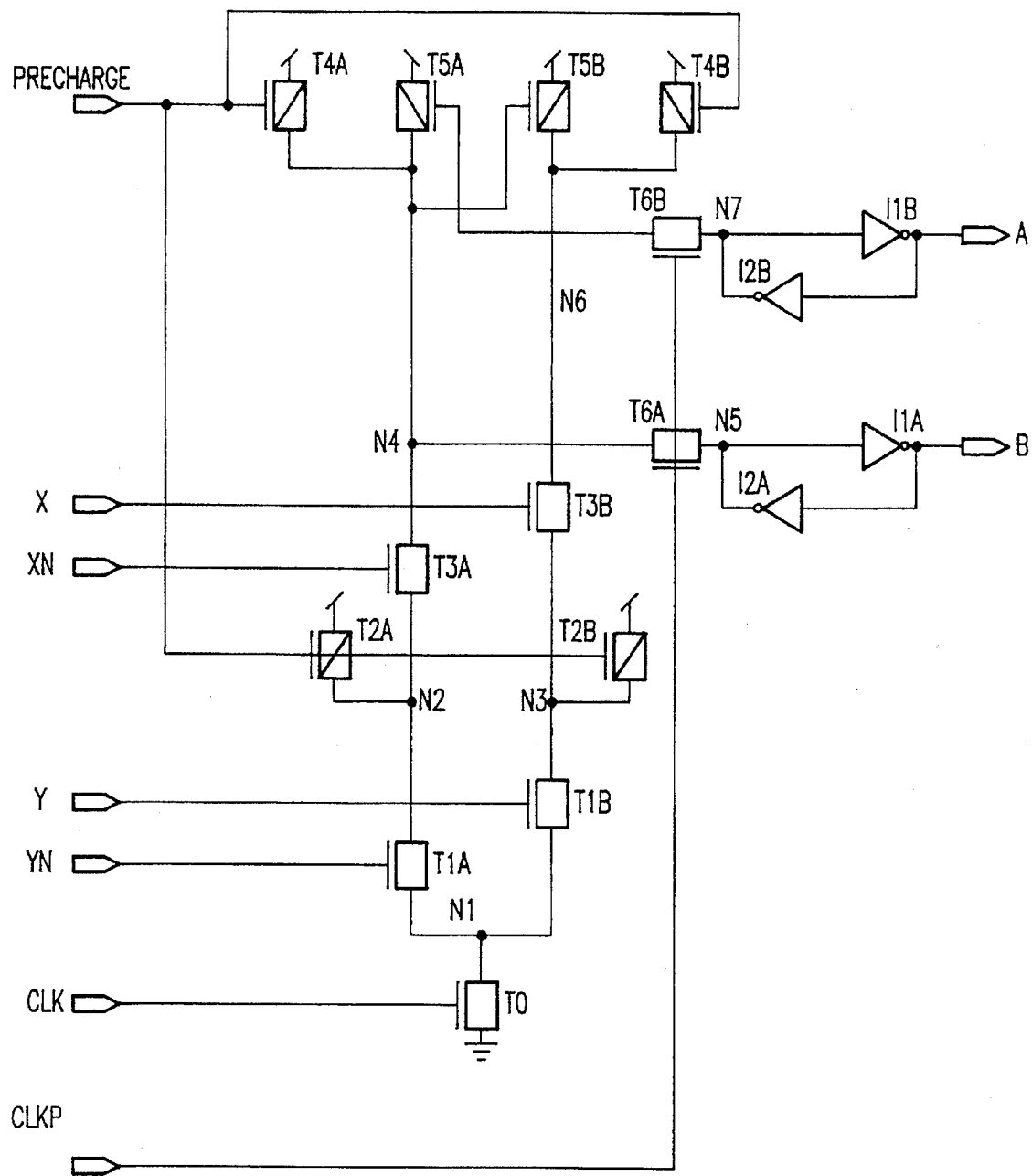
FIG. 4 is an exemplary schematic illustration of a preferred form of an embodiment of the invention combining the precharge and reset functions of the circuit of FIG. 3 with an output latch controllably isolated from the receiver/decoder.

A preferred circuit omitting reset and precharge is shown in FIG. 4. In this circuit, as compared with that of FIG. 3, transistors T5A and T5B are omitted and precharge is performed through transistors T2A, T2B, T4A and T4B. The outputs could be pulled to a supply or reference voltage in the same manner, effectively achieving a reset=like function. However, since it is often useful to provide latching of outputs past the end of a clock cycle to allow earlier initiation of evaluation or otherwise adjust timing of the propagation of signals in the circuit, a transmission gate responsive to a further clock signal CLKP is provided by transistors T6A and T6B serially connected in the output lines. CLKP can be timed with CLK so that the output states are updated upon the evaluation of the inputs Unclocked output latches respectively formed by cross-coupled inverters I1A, I1B and I2A, I2B are also provided in series with the transmission gates. Thus, the outputs will be latched at the most recently transmitted states of N4 and N5, respectively, until updated through the transmission gates in response to CLKP.

Figure 5:
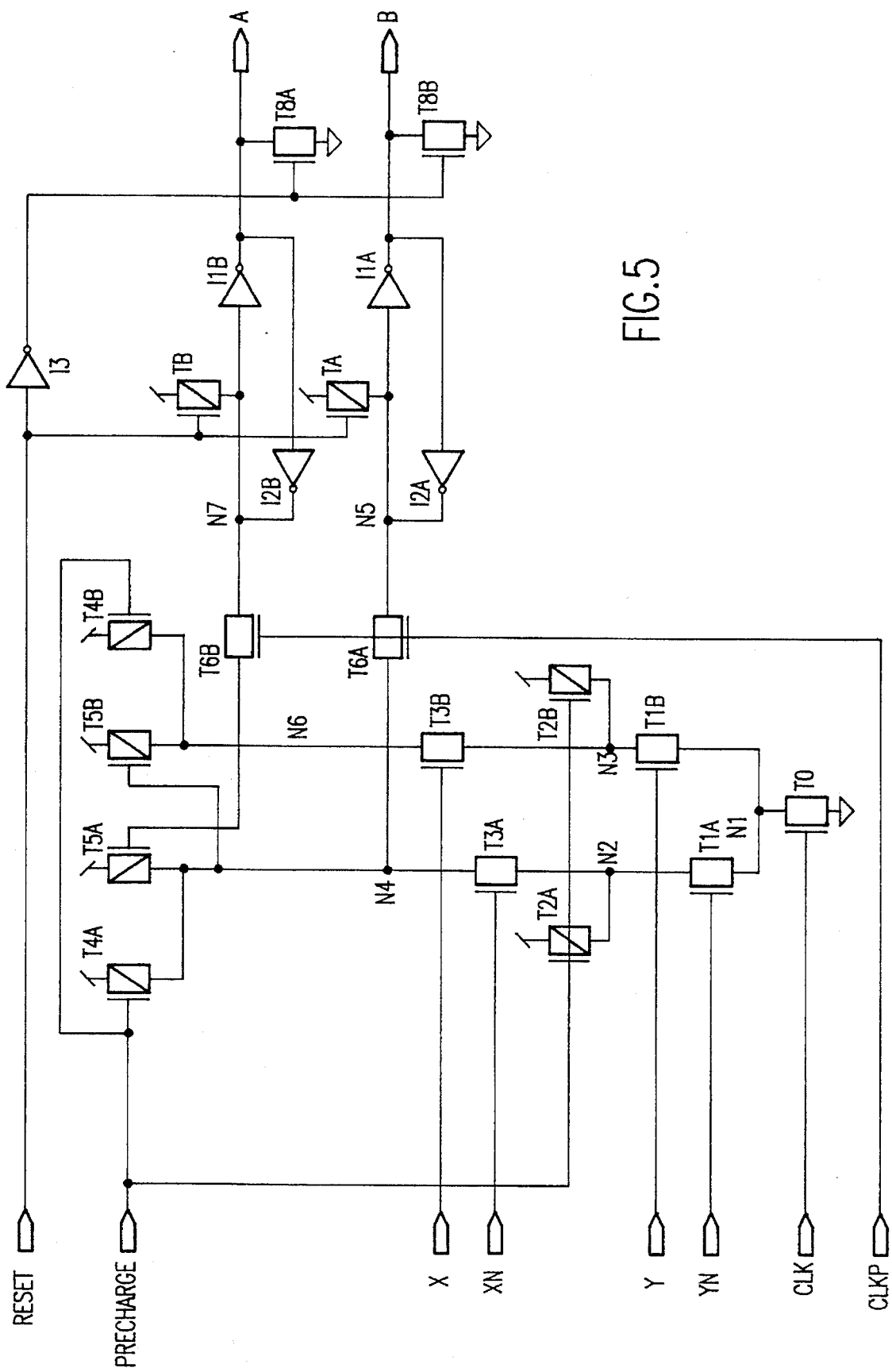
FIG. 5 is a variation of the circuit of FIG. 4 including output signal truncation or reset independent of the reset/precharge and evaluation of the receiver/decoder.

Even when the output is latched and the latches isolated from the receiver decoder for the purpose of allowing faster operation and earlier evaluation, it is sometimes desirable to provide truncation of the output signal of a circuit so that precharge of a following stage can be conducted earlier. A variation of the circuit of FIG. 4 which provides this facility is shown in FIG. 5. In this case, a reset signal drives the inverters to a common inactive state by pulling up nodes N6 and N7 through transistors TA and TB and, after being inverted, pulls the outputs A and B to ground through transistors TSA and TSB. Further, this circuit can be used to disable the output for testing purposes or for other purposes such as easily implementing additional logic inputs to the 2-of-N receiver decoders without response speed penalty.

Returning now to FIG. 2, a preferred technique of expanding the principles of the invention to provide a greater number of inputs and selection outputs will be described. Essentially, as shown in dashed lines, another pair of 2-of-N receiver/decoders 23, 24 is provided and all receiver/decoders are responsive to Z and Zc signals, the order of these inputs being reversed to receiver/decoders 23 and 24 indicated at Zi. The Z inputs may thus be considered as a most- or least-significant bit upon which the pairs of receiver decoders are partitioned. However, as before, these illustrated connections should be regarded as exemplary and any other connections establishing mutual exclusivity of operation of the receiver decoders, the combinations recognized and the outputs energized. Of course, in principle there is no reason duplicate functions could not be provided if deemed to justify the circuitry involved, such as for compelling reasons of integrated circuit layout or fan-out. This technique may be repeated as desired to accommodate as many inputs and outputs as required.

As a matter of high performance design implementing the invention in dynamic logic, it should be noted that response of the decoder will be somewhat impaired by increased height (e.g. the number of serially connected transistors) of the decoder trees. For a decoder height of two transistors AND/NAND logic clearly provides fastest operation. In view of further circuit complexities and power consumption involved in OR/NOR logic (inputs and outputs must all be inverted or rearranged, circuit layouts may be complicated by parallel connections and rather than a single transition to provide a 1-of-N coded selection, N-1 transitions would be involved) AND/NAND would be preferred for three and probably four pairs of input signals to each of the 2-of-N receiver/decoders. However, if speed of response is critical, one or both of the signals of the third (and fourth, if needed) input signal pair could be applied to a circuit such as either the transmission gate or reset/output signal truncation circuit of FIG. 5 to inhibit the output and thus partition the decoder.

For four or more pairs of input signals and corresponding sixteen or more outputs, it may be preferable to multiply the portion of the circuit of FIG. 2 and evaluate the input in groups of two input pairs each with a further stage for combining and decoding the outputs, as a matter of limiting circuit complexity and although two or more stages of evaluation would be required, in view of the faster response speed of the smaller circuits.

In short, while the principles of the invention are theoretically applicable to any number of inputs and outputs to provide a high performance selection circuit in dynamic logic, speed and other advantages achieved through combining the input signal receiving and decoding functions in a single stage are most pronounced for relatively small selectors.

Similarly, CMPD and CLK could be or be derived from opposite logic states of the same signal since precharge and evaluation are mutually exclusive operations. However, in this case, separate reset would generally be desirable for reasons of timing flexibility. Additionally, separate clock transistors could be provided for each logic tree for layout symmetry or other reasons but is generally not desirable since noise immunity might be compromised because simultaneous enablement of conduction of logic trees would not be guaranteed. (When the latch is balanced, some conduction may occur through both logic trees when evaluation is initiated and simultaneous enablement of conduction increases the speed with which the latch reaches a stable state whereas noise during the period when one logic tree was enabled but not the other could cause erroneous operation.)

In view of the foregoing, it is seen that the invention provides a high performance circuit with combined evaluation and decoding functions which may be advantageously implemented with dynamic logic circuits which can be simply reset and precharged since input signals need only be propagated through a single logic stage. The increased speed of the decoding operation and the simplification of reset and precharge procedures which can thus also be more quickly accomplished greatly increases the number of operations which can be performed in a given interval of time. Thus the decoder in accordance with the invention may be used to advantage in such applications as multiplexed operations in memories whereby plural read and/or write operations may be performed in a single cycle and other operations where the increased bandwidth of the decoder in accordance with the invention may exceed the bandwidth of other circuits implemented in the same technology on the same chip, thereby increasing the functionality of the latter.

While the invention has been described in terms of a single preferred embodiment, those skilled in the art will recognize that the invention can be practiced with modification within the spirit and scope of the appended claims. For example, more identical circuits such as those of FIGS. 3 and 4 could be employed with expanded input distribution and combination of outputs, if desired, to the decoding of larger numbers of encoded input signals and selection from among a larger group of possible outputs.

Having thus described my invention, what I claim as new and desire to secure by Letters Patent is as follows:

1. A receiver/decoder implemented in dynamic logic including
   at least two selector circuits connected to a plurality of input signals in distinct orders, each selector circuit comprising
      a latch circuit having two transistors,
      at least two logic tree circuits, each respective logic tree circuit being serially connected with one transistor of said latch circuit, and
      a clock transistor connected in series with at least one of said logic tree circuits.

2. A receiver/decoder circuit as recited in claim 1, wherein each of said at least two selector circuits has a 2-of-$2^N$ selection function.

3. A receiver/decoder circuit as recited in claim 1, wherein at least one of said at least two decoder tree circuits is implemented in AND/NAND logic.

4. A receiver/decoder circuit as recited in claim 1, wherein each of said selector circuits further includes
   means for latching a signal appearing at an output node of said latch circuit, and
   means for selectively isolating said means for latching from a respective output node of said latch circuit.

5. A receiver/decoder circuit as recited in claim 4, wherein each of said selector circuits further includes
   means for selectively resetting said means for latching a signal.

6. A receiver/decoder as recited in claim 1, further including
   means connected to an input of said latch circuit for driving said input of said latch circuit to a reference voltage in response to a reset signal.

7. A receiver/decoder as recited in claim 1, further including an inverter circuit connected to an output of said latch circuit, and
   means connected to an output of said inverter circuit for driving said output of said inverter circuit to a reference voltage in response to a reset signal.

8. A receiver/decoder as recited in claim 6, further including an inverter circuit connected to an output of said latch circuit, and
   means connected to an output of said inverter circuit for driving said output of said inverter circuit to a reference voltage in response to a reset signal.

9. A receiver/decoder as recited in claim 1, further including
   means connected to an intermediate node of each of said at least two logic tree circuits for preventing conduction in said logic tree circuits during precharge.

10. A receiver/decoder as recited in claim 8, further including
    means connected to an intermediate node of each of said at least two logic tree circuits for preventing conduction in said logic tree circuits during precharge.

11. A partitioned integrated circuit including a receiver/decoder circuit including
    at least two selector circuits connected to a plurality of input signals in distinct orders, each selector circuit comprising
       a latch circuit having two transistors,
       at least two logic tree circuits, each respective logic tree circuit being serially connected with one transistor of said latch circuit, and
       a clock transistor connected in series with at least one of said logic tree circuits and
    means responsive to an output of said at least two selector circuits for enabling a partition.

12. An integrated circuit as recited in claim 11, wherein each of said at least two selector circuits has a 2-of-$2^N$ selection function.

13. An integrated circuit as recited in claim 11, wherein at least one of said at least two decoder tree circuits is implemented in AND/NAND logic.

14. An integrated circuit as recited in claim 11, wherein each of said selector circuits further includes
    means for latching a signal appearing at an output node of said latch circuit, and
    means for selectively isolating said means for latching from a respective output node of said latch circuit.

15. An integrated circuit as recited in claim 14, wherein each of said selector circuits further includes
    means for selectively resetting said means for latching a signal.

16. A partitioned integrated circuit as recited in claim 11, said receiver/decoder further including
    means connected to an input of said latch circuit for driving said input of said latch circuit to a reference voltage in response to a reset signal.

17. A partitioned integrated circuit as recited in claim 11, said receiver/decoder further including an inverter circuit connected to an output of said latch circuit, and means connected to an output of said inverter circuit for driving said output of said inverter circuit to a reference voltage in response to a reset signal.

18. A partitioned integrated circuit as recited in claim 16, said receiver/decoder further including an inverter circuit connected to an output of said latch circuit, and means connected to an output of said inverter circuit for driving said output of said inverter circuit to a reference voltage in response to a reset signal.

19. A partitioned integrated circuit as recited in claim 11, said receiver/decoder further including means connected to an intermediate node of each of said at least two logic tree circuits for preventing conduction in said logic tree circuits during precharge.

20. A partitioned integrated circuit as recited in claim 17, said receiver/decoder further including means connected to an intermediate node of each of said at least two logic tree circuits for preventing conduction in said logic tree circuits during precharge.

* * * * *